Aug. 6, 1957 H. J. WOLL 2,802,066

WIDE-BAND HIGH FREQUENCY AMPLIFIER

Filed July 1, 1953 3 Sheets-Sheet 1

INVENTOR.
HARRY J. WOLL

BY [signature]

ATTORNEY

Aug. 6, 1957 H. J. WOLL 2,802,066

WIDE-BAND HIGH FREQUENCY AMPLIFIER

Filed July 1, 1953 3 Sheets-Sheet 2

INVENTOR.
HARRY J. WOLL

BY H. C. Newton

ATTORNEY

Aug. 6, 1957 H. J. WOLL 2,802,066

WIDE-BAND HIGH FREQUENCY AMPLIFIER

Filed July 1, 1953 3 Sheets-Sheet 3

INVENTOR.
HARRY J. WOLL

BY H. L. Newton [signature]

ATTORNEY

United States Patent Office 2,802,066

Patented Aug. 6, 1957

2,802,066

WIDE-BAND HIGH FREQUENCY AMPLIFIER

Harry J. Woll, Audubon, N. J., assignor to Radio Corporation of America, a corporation of Delaware Application July 1, 1953, Serial No. 365,494

8 Claims. (Cl. 179—171)

This invention relates to high frequency wide-band signal amplifiers and more particularly to high frequency wide-band signal amplifiers of the multistage stagger-tuned type.

In order to obtain wide band frequency response in amplifiers of the type referred to, various circuit configurations have been tried heretofore. Among these is one in which the value of the Q in the tuned circuit is effectively decreased. However, to amplify a relatively wide frequency band efficiently, i. e., to obtain a given gain over a specified band-width with a minimum number of tubes, it was considered necessary to use either relatively complicated interstage coupling means or a larger series of simple interstage coupling means, as in a stagger tuned amplifier, as is well known.

In such prior known amplifier circuits the simplicity of the single tuned amplifier is retained and the desired gain vs. bandwidth product and slower narrowing of the overall bandwidth of multituned networks is obtained generally by stagger tuning. By properly adjusting tuning frequencies and damping of individual single tuned stages, results approaching that obtainable with multituned coupling were thus obtained with little sacrifice of simplicity. It is well known that in circuits such as those used for stagger tuning, the tuned circuits in the various stages of amplification are tuned to different frequencies, but all are within the desired range of the band to be passed. In order to obtain the over-all characteristics desired, the Q of each circuit is adjusted to produce a certain amount of overlap.

The present invention provides a novel combination of two known configurations to provide an improved wide band stagger tuned amplifier. The improved stagger tuned amplifier comprises at least two stages. One of the stages includes a resonant circuit tuned to the high portion of the band of frequencies to be amplified. An inductance comprising part of the resonant circuit includes a coil coupled directly from the plate circuit of the first stage to the input circuit of the second stage. In some cases, a transformer having a primary and secondary winding is used in place of this coil. The interstage coupling from the plate circuit of the second stage in a practical embodiment may comprise a resonant circuit including an autotransformer tuned to the low frequency portion of the band, a tap of which is connected to a utilization circuit, which is substantially resistive. A certain amount of overlap between the frequency response band of the first and second stages is provided to produce a combined response band from the second stage by which signals in the desired frequency band width are amplified.

It is an object of this invention to provide an improved stagger-tuned wide band amplifier circuit wherein an increase in gain is obtained over the gain of prior known staggered tuned amplifier circuits.

It is a further object of this invention to provide an improved stagger-tuned amplifier circuit wherein an increase in gain may be obtained from a circuit of equivalent simplicity to prior known stagger-tuned circuits.

Other objects of the invention will become apparent from the following description when read in conjunction with the accompanying drawing, and the novel features of the invention are defined in the appended claims.

A common circuit configuration in wide-band amplifiers is the "staggered pair" such as described on page 187 in "Vacuum Tube Amplifier" by Valley and Wallman. This invention pertains to an improvement in the staggered pair configuration which results in two or three more decibels per pair in a typical case. This improvement in the staggered pair configuration is particularly applicable to cascaded grounded-grid amplifiers. However, it is not limited to grounded grid amplifiers and may be used where the input circuit is substantially resistive.

Figure 1:
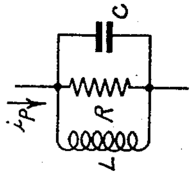
Figures 1 and 2 are schematic circuit diagrams of two single-tuned signal circuits illustrating a principle of the invention.
Figure 2:
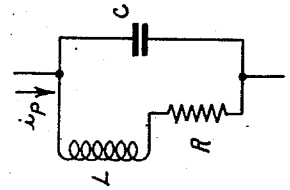

Referring to the drawings and in particular to Figures 1 and 2, conventionally, the two interstage coupling means in a staggered pair are single-tuned circuits such as shown in Figure 1 wherein a tuning inductor or coil L, a resistor R and a tuning capacitor C, in parallel relationship, provide a tuned signal responsive network or circuit.

If this interstage coupling network or circuit is used in a cascaded grounded-grid amplifier, the resistor R can be the reflected load of the following stage rather than a physical resistor. This can be accomplished by making the tuning inductor L in the form of an auto-transformer.

Another type of single tuned circuit that may be used as one of the interstage coupling means in a staggered pair of amplifiers is shown in Figure 2, wherein a tuning inductor or coil L and a resistor R are serially connected in parallel with a tuning capacitor C.

In particular cases the resistor R may be the input impedance of the following stage and no physical resistor would then be necessary. The inductor L and the resistor R may be combined effectively in a suitable single inductor, transformer or auto-transformer, wherein the effective impedance is equivalent to an inductance and resistance serially connected and in parallel with the capacitance of the capacitor C.

A measure of the power gain with each interstage coupling circuit is the power delivered to the resistor per unit of squared current. This is:

$$\text{Power gain} = \frac{P}{ip^2} = \frac{R}{R^2\left(\omega C - \frac{1}{\omega L}\right)^2 + 1}$$

for the circuit in Figure 1 and:

$$\text{Power gain} = \frac{P}{ip^2} = \frac{\frac{1}{\omega^2 R^2 C^2}}{\frac{L^2}{R^2 C^2}\left(\omega C - \frac{1}{\omega L}\right)^2 + 1}$$

for the circuit in Figure 2, where $\omega = 2\pi f$.

The relative power gain with each of these two interstage coupling circuits indicates that the circuit of Figure 2 results in more power gain than for the circuit shown in Figure 1 for circuits which are equivalent in bandwidth and response.

Figures 3, 4:
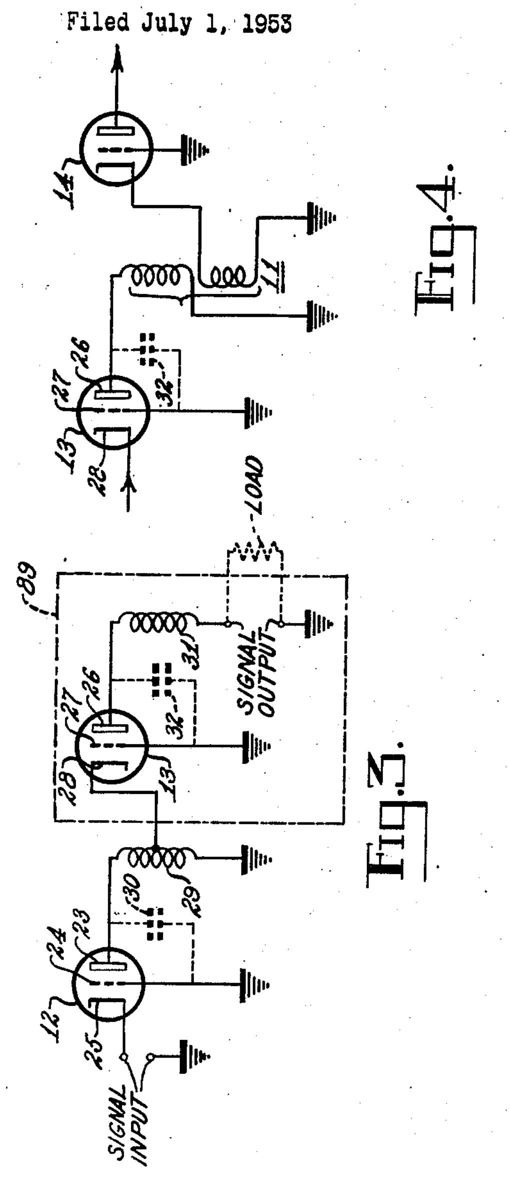
Figure 3 is a schematic circuit diagram in simplified form, of a signal amplifier embodying the invention.
Figure 4 is a schematic circuit diagram of a modification of the amplifier circuit shown in Figure 3, in accordance with the invention.

Referring now to Figure 3 and the signal amplifying circuit shown, it will be noted that this circuit combines the two types of interstage coupling networks as shown in Figures 1 and 2.

The first stage comprises a triode tube 12, wherein the control grid 24 is returned to a point of reference potential for the system such as the chassis, hereinafter referred to as ground. A pair of signal input terminals provide means for applying a signal voltage between the cathode 25 and ground. In the output circuit of the tube 12, there is an inductance comprising an auto-transformer 29 connected to the anode or plate 23, which receives the electrons from the emitter or cathode 25. This inductance provides a resonant circuit with the interelectrode capacitance 30 of the tube 12. The circuit shown in connection with tube 12 is substantially equivalent to the tuned circuit shown in Figure 1.

A tap on the auto-transformer 29 is connected to the cathode 28 of the following triode amplifier device or tube 13 which comprises part of the second amplifier stage. The grid 27 of this tube is also returned to ground. The output circuit from plate 26 includes an inductance element such as a tuning inductor or coil 31. This inductor forms a resonant circuit with the interelectrodal capacitance 32 of the amplifier tube 13. The inductor 31 is serially connected in the plate circuit to a pair of output terminals one of which is connected to ground as shown, whereby the signal output may be applied to a following stage or other load circuit which is substantially resistive as indicated. It will be noted that this circuit is substantially equivalent to the circuit shown in Figure 2.

In comparing the combined power gain of the two interstage coupling networks shown in Figure 3, with the combined power gain of a typical amplifier system using two interstage coupling networks as shown in Figure 1, using auto-transformers, it has been found that the circuit involved in Figure 3 results in two or three decibels more power gain.

Figure 5:
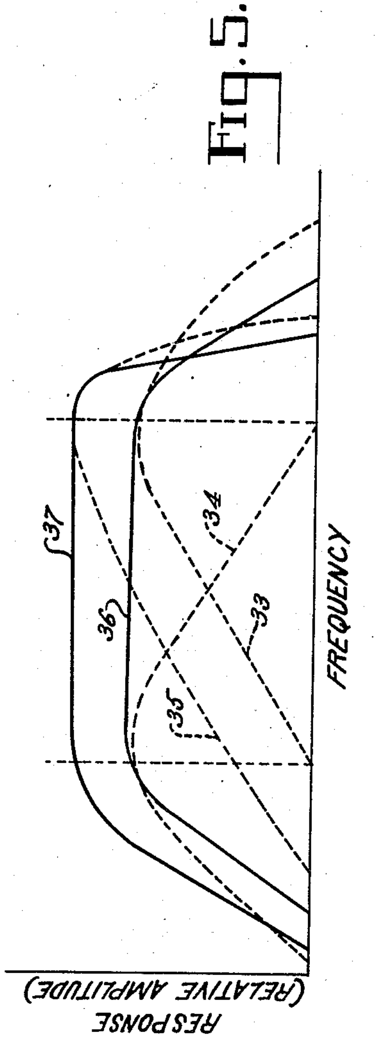
Figure 5 is a graph showing curves illustrating certain operating characteristics of an amplifier embodying the invention in comparison with certain prior art circuits.

Referring particularly to Figure 5, the frequency characteristics of response curves 33 and 34 illustrate the frequency response characteristic of a circuit such as illustrated in Figure 1, the curve 33 being that for the circuit when tuned to the high frequency portion of the band and the curve 34 being that for the circuit when tuned to the low frequency portion of the band. The combined response characteristic of two cascaded circuits tuned according to the curves 33 and 34 is illustrated by the response curve 36.

Further referring to Figure 5, response curve 35 illustrates the frequency response characteristic of a circuit such as that shown in Figure 2, when such a circuit is used to resonate to the high frequency portion of the frequency band referred to above. If now a circuit similar to the one shown in Figure 1 is used to resonate to the low frequency portion of said band, the response would be that shown in the characteristic curve 34, as previously mentioned. The combined response of two cascaded circuits so tuned and having the response characteristics 34 and 35 is illustrated by characteristic curve 37. The greatly increased response, as illustrated by characteristic curve 37 over that shown by the curve 36, results from the use of the two different cascaded amplifier circuits as illustrated in Figures 1 and 2, rather than the conventional use of two like circuits similar to that of Figure 1.

In some cases, the circuit shown in Figure 2 cannot be used because the given values of R, L and C do not result in a desired band-width. If a transformer with proper leakage inductance is inserted, however, another variable may be introduced and both the desired center frequency and band-width may be obtained with a given R and C.

Referring to Figure 4, along with Figure 3, a circuit which may in accordance with the invention be substituted for that portion of the circuit of Figure 3 contained within the dotted rectangle 89 illustrates the use of transformer coupling in the plate circuit of the second stage amplified tube 13 of the circuit of Figure 3, the inductance of the primary winding of the transformer 11 serving as the tuning inductor for the circuit. This inductor is tuned by the same interelectrodal capacity 32 in the circuit and the resistive component is reflected back into the circuit from the load, which may be the cathode circuit of a following amplifier stage 14 in this case, through the secondary winding of the transformer.

Figure 6:
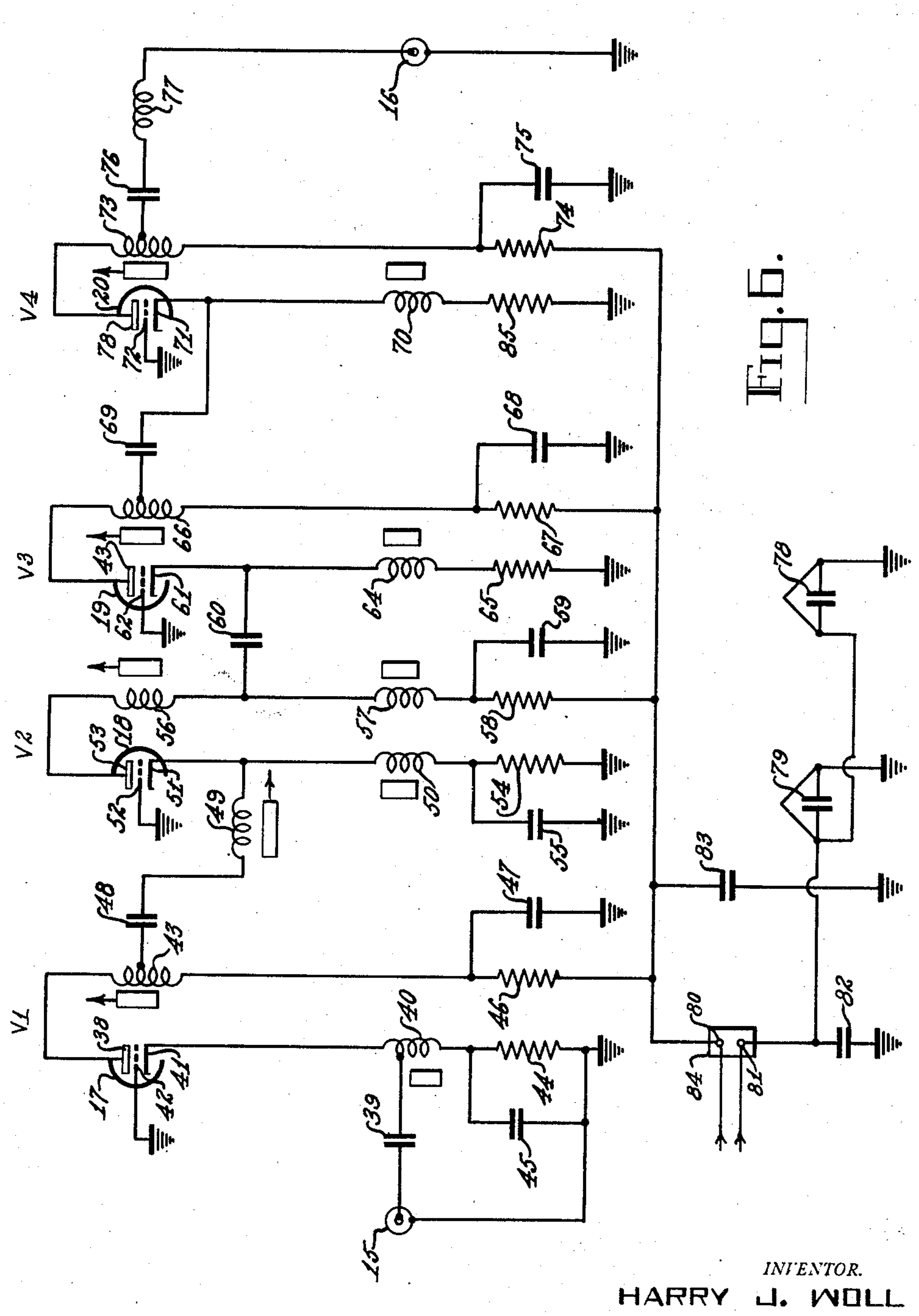
Figure 6 is a schematic circuit diagram of a stagger-tuned wide-band high frequency amplifier circuit embodying the invention.

Referring particularly to Figure 6 of the drawing, and the wide band high frequency amplifier shown therein, it will be noted that four amplifier stages V1, V2, V3 and V4 are connected in cascade between input and output circuit connection means or plug connectors 15 and 16. Input signals from an antenna or other signal source are applied to the amplifier through the input connection means 15 and are passed through a coupling network having a coupling capacitor 39 and a coupling coil 40 to the cathode 41 of a first stage amplifier tube 17. This network also provides impedance matching between the tube input circuit and an incoming line or signal source. Bias voltage for the tube 17 is provided by the voltage drop developed across a cathode resistor 44, provided with a cathode by-pass capacitor 45 for signal frequencies, while the grid 42 is returned to ground as shown. A resistor 46 and capacitor 47 are used for decoupling the plate circuit from the power supply.

The signal output from the plate 38 of the amplifier tube 17 is applied to a double tuned circuit designed to give maximum response to signals in the full band of frequencies to be covered. The first part of this double tuned circuit comprises a resonant circuit having a tuning inductor or coil 43 tuned with the interelectrode capacitance of the tube 17 and connected between the plate 38 and the decoupling resistor 46. The inductor 43 may preferably be variable or adjustable as indicated to facilitate tuning with the interelectrodal capacity referred to. The second portion of the double tuned circuit comprises a series resonant circuit including capacitance provided by the capacitor 48 and the second tuning inductor or coil 49, the latter being connected to the cathode 51 of the second stage tube 18. The output circuit of the tube 18 is also constructed in accordance with the invention. A tuning inductance element or coil 56 which may be variable or adjustable as indicated is connected serially in the plate circuit of the amplifier tube 18 and in conjunction with the interelectrodal capacitance thereof effectively provides a resonant circuit tunable to a desired frequency or frequency band. In the embodiment shown and as described in connection with the graph in Figure 5, the desired frequency band is the high frequency portion of the band of frequencies to be covered by the amplifying system. Plate current is supplied to the plate 53 through the tuning inductor 56 and a choke coil 67 and a decoupling resistor 58. A filter 59 is connected to ground across said resistor. The grid 52 of the tube 18 is returned to ground. The coil 50 is a choke coil across which the signal is developed. A resistor 54 and a capacitor 55 are used for cathode bias and by-pass, respectively.

The signal output from the amplifier tube 18, wherein a high frequency portion of the signal band is amplified, is applied from the plate 53 to the input cathode 61 of the following amplifier tube 19 through a coupling capacitor 60. A choke coil 64 is in the cathode circuit of this stage to raise the cathode above ground and a series resistor 65 is used to provide cathode bias for the triode tube 19. The grid 62 is returned to ground. A resistor 67 and a capacitor 68 provide decoupling for the plate or output circuit of the amplifier tube 19.

Further in accordance with the invention, a tuning inductor or coil 66 forms a resonant circuit with the interelectrodal capacitance of the amplifier tube 19 also in this circuit, and may be tuned to any desired frequency or frequency band. In the present embodiment, the frequency response band is the low frequency portion of the band of frequencies desired to be covered by the amplifier system, as described in conjunction with the graphs of Figure 5. The coil 66 is in the form of an auto-transformer having a tap connection between its ends. Means including a capacitor 69 are used to couple the output circuit of the tube 19 to the following stage V4. The response of stages V2 and V3 is adjusted so that the combined response is essentially flat over the desired frequency band for the amplifying system such as illustrated by the characteristic curve 37 of Figure 5. The remainder of the circuit in stage V3 includes a plate decoupling resistor 67 and filter capacitor 68.

The signal voltage at the tap on the plate circuit tuning coil 66 is coupled by a capacitor 69 to the cathode 71 of a tube 20 which is the amplifier device of the stage V4. The coil 70 is an R.-F. choke coil in the cathode circuit of the tube 20 and the resistor 85 provides the grid bias for this tube. The grid 72 of the tube 20 is returned to ground. The output of tube 20 is fed from the plate 78 to another double tuned circuit, designed to pass the desired frequency band with substantially uniform amplification. The first portion of this double-tuned circuit consists of a tapped tuning inductor or coil 73 tuned in conjunction with the interelectrodal capacitance of tube 20 to the desired frequency band. The second portion of the double-tuned circuit consists of a coupling capacitor 76 and a coil or tuning inductor 77 serially connected between the capacitor 76 and the output coupling connector 16, one side of which returns to ground. The resistor 74 is a plate decoupling resistor provided with a filter capacitor 75.

The plate and filament voltages necessary for the operation of this amplifier are provided by means of an external source (not shown) connected through the supply plug 84 having a terminal 80 for the B+ voltage supply. The terminal 81 of this plug provides for connection to a suitable filament voltage supply circuit for the tubes 17, 18, 19 and 20. The capacitors 78 and 79 are filter capacitors for the tube filaments or heaters, while the capacitors 82 and 83 are filter capacitors for the plate supply circuits as indicated. Only two filaments or heaters are indicated, as the tubes 17 and 18 and the tubes 19 and 20 may be dual triodes having common heaters for the cathodes.

Figure 7:
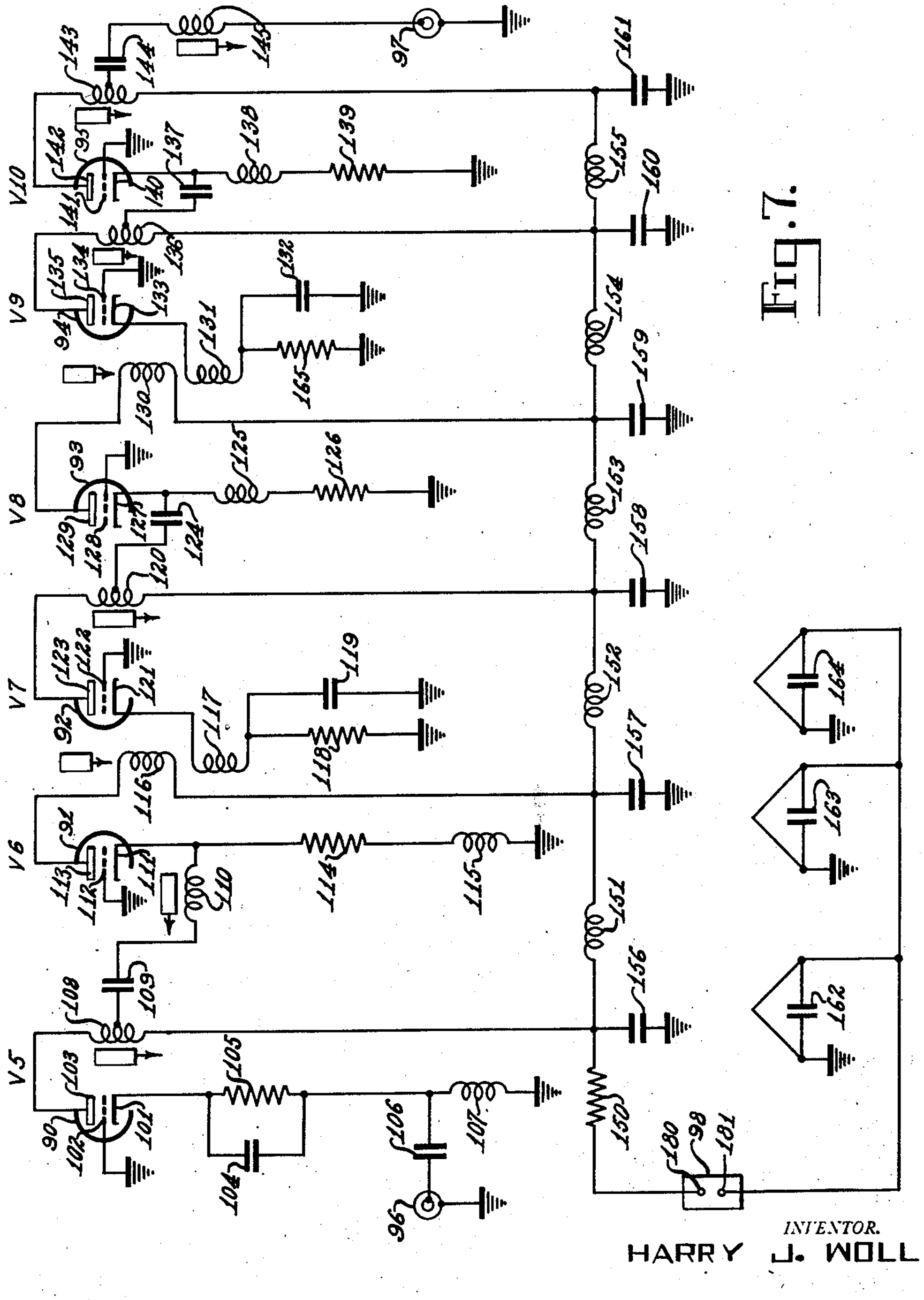
Figure 7 is a schematic circuit diagram of a stagger-tuned wide-band amplifier circuit, as modification of the circuit of Figure 6, also embodying the invention.

Referring to Figure 7, a wide-band radio frequency amplifier utilizing stagger tuning as illustrating another preferred embodiment of the invention, is arranged to include six stages of amplification connected in cascade.

Input signals are applied at a suitable connector or input jack 96 to the cathode circuit of tube 90 through a coupling capacitor 106 and across an input choke coil 107 included serially in the cathode circuit with a resistor 105 which provides grid bias for the tube. A capacitor 104 provides a by-pass for the cathode circuit bias resistor 105. The grid 102 is returned to ground as in the preceding modification.

The plate circuit signal output of the tube 90 is applied to a double tuned circuit, designed so as to pass the desired frequency band with uniform amplification. The first portion of this double tuned circuit consists of a tuning inductor or coil 108 tuned in conjunction with the interelectrode capacitance of tube 90. The second portion of the double tuned circuit consists of tuning capacitor 109 and tuning inductor or coil 110 connected in series to the cathode 111 of tube 91. A resistor 114 provides grid bias for the desired operation of the tube 91 and the coil 115 is a choke coil in the cathode circuit to provide a high impedance to the signal currents. The grid 112 of tube 91 is returned to ground.

In the output circuit of the triode tube 91 a transformer comprising a primary coil 116 in the plate circuit and a secondary coil 117 coupled with the following stage, form part of a resonant circuit having a desired frequency response when tuned by the interelectrodal capacitance of the tube. In this embodiment, the resonant circuit is responsive to the higher portion of the frequency band to be covered. The effect of this coupling network is similar to the effect of the connection with coupling network described in Figure 6 wherein the resonant circuit for the high frequency portion of the band comprises a single coil 56. This exact circuitry is not used in this embodiment, since such coupling circuits do not always have the same requirement regarding bandwidth in amplifier systems of this type. As previously mentioned, using a transformer or auto-transformer having the proper leakage inductance rather than a single inductor may permit both the desired impedance (i. e., resistive input impedance of next stage) and the desired series inductance to be attained.

The secondary coil 117 is connected directly to the cathode 121 of the tube 92 and hence reflects the resistive load back into the plate circuit. The resistor 118 provides grid bias for the tube 92 and a capacitor 119 provides a by-pass path for the cathode circuit. The grid 122 of the tube 92 is returned directly to ground.

The output circuit of the tube 92 further operates in accordance with the invention. The output circuit comprises a tuning inductor or auto-transformer coil 120 which, with the interelectrodal capacitance of the tube 92 forms a resonant circuit at the low frequency portion of the signal band to be amplified by the system. The action of this circuit is similar to that of the resonant circuit described in connection with coil 66 of Figure 6. The response of this stage and the previous stage is adjusted so that the combined response is essentially flat over the desired band, as referred to in connection with the graphs of Figure 5. The signal output from the tube 92 is tapped off an intermediate tap on coil 120 and coupled to the cathode 127 of the amplifier tube 93 of the following stage. A resistor 126 provides the grid bias for the tube 93. A high frequency choke coil 125 is connected in the cathode circuit of this stage to act as a coupling impedance. The grid 128 of the tube 93 is returned to ground.

The signal output from the tube 93 is applied to the primary 130 of a coupling transformer having a secondary 131. The plate circuit inductance thus provided together with the interelectrodal capacitance of the tube 93 is resonant to the high frequency portion of the frequency band to be amplified by the system. This is substantially the same circuit arrangement shown in connection with the output circuit of tube 91 of this embodiment and previously described. The transformer coils 130 and 131 operate in a similar manner to coils 116 and 117, previously described. The secondary coil 131 is connected to the cathode 133 of the tube 94 and hence reflects this load into the primary circuit. A resistor 132 provides the bias for tube 94 and a capacitor 132 provides the by-pass path for the cathode circuit. The grid 134 is returned directly to ground.

The signal output of the tube 94 is applied to an auto-transformer coil 136 which, together with the interelectrodal capacitance of the tube 94 is resonant to the lower portion of the frequency band to be covered by the system. This is substantially the same circuit arrangement as shown in connection with the output circuit of tube 92, and previously described. Coil 136 acts in a manner similar to the coil 120 forming a resonant circuit with the interelectrodal capacitance of tube 94. The response of this stage and the previous stage is adjusted so that the combined response is essentially flat over the desired band as described with reference to curve 37 of Figure 5.

The signal voltage is taken from the inductor 136 and coupled to the cathode 140 of a following amplifier tube 95 by means of the coupling capacitor 137. A resistor 139 provides grid bias voltage for the tube 95 and a choke coil 138 is connected serially in the cathode circuit to provide a high coupling impedance for the signal currents. The grid 141 of the tube 95 is returned directly to ground.

The output of the tube 95 is applied to a double tuned circuit, designed so as to pass the desired frequency band with substantially uniform amplification. The first portion of this double tuned circuit consists of a coil 143 in conjunction with the interelectrode capacitance of the tube 95 forming a resonant circuit. The second portion of the double tuned circuit consists of a resonant circuit having a capacitor 144 and a turning coil 145 connected in series. The output from the double tuned circuit is applied through the tuning coil 145 across the terminals of the output jack 97 one side of which is grounded as indicated.

Choke coils 151, 152, 153, 154 and 155 are used along with capacitances 156, 157, 158, 159, 160 and 161 to provide a filter arrangement and to isolate the signal currents from the power supply. A semi-resistor 150 provides isolation of the plate circuits from the power supply.

The plate current for the amplifying system is supplied from an external source, not shown, through an input plug or connector 98 having a terminal 180 for the plate voltage and a terminal 181 for the tube filament or heater current. Capacitors 162, 163 and 164 are suitably connected to filter the radio frequency or signal circuit from the tube filaments.

Preferred embodiments of the invention make use of grounded-grid amplifiers. Multi-stage triode tube amplifiers have come into extensive use for high and medium high frequency applications. The extensive use of triodes results from the reduced noise attainable as compared with the use of multi-grid amplifier tubes. With triodes, as is well known, it is difficult to use conventional circuits with the signal input into the grid circuit and with the signal output being taken from the plate circuit because this mode of operation may result in excessive output-to-input feedback and produce regeneration or oscillation. The grounded grid amplifier circuit alleviates these difficulties by utilizing the grid as a shield between the input or cathode circuit and the output or plate circuit.

However, the use of grounded-grid amplifiers is not essential to all embodiments of the invention.

High frequency signal amplifier circuits having largely a resistive input characteristic may be used in accordance with the invention.

It should be further understood that the order of the stages in the cascade connection is not critical. For example, the high frequency portion of the band may be amplified before the low frequency portion, or vice versa.

In the embodiments shown, the triodes used may be separate tubes or double triode tubes, wherein the elements for two triodes are combined in a single envelope. In such a case wherein the elements for two triodes are contained within a single envelope, one filament will serve to heat the two cathode elements within the tube as shown and referred to herein.

What is claimed is:

1. A wide-band high frequency signal amplifier comprising a series of amplifying stages and interstage coupling networks therebetween, each of said stages including an electron tube having an interelectrode capacitance, each of said networks including a tuning inductance element arranged in parallel with the interelectrode capacitance of one of said electron tubes to provide for the tuning of said inductance elements within a predetermined frequency band, a first of said networks including a first inductance element being parallel resonant to a lower portion of said predetermined frequency band, means providing a resistive component effectively connected in parallel with said first inductance element, another of said coupling networks including a second inductance element successively in circuit with said first network being parallel resonant to a higher frequency portion of said band, and means providing a resistive component effectively connected in series with said second inductive element, said networks being tuned so that the responses of the individual networks overlap to provide a uniform response over the combined band.

2. A stagger-tuned wide-band signal amplifier comprising a series of cascade-coupled electron-tube amplifier stages and interstages coupling networks therefore, each coupling network including a tunable inductive element arranged in parallel with the interelectrode capacitance of an electron tube for determining the frequency response of said signal amplifier, a first of said networks being tuned to a predetermined low frequency portion of a band of signal frequencies to be translated by said signal amplifier, means providing a resistive element effectively in parallel with the inductive element of said first network, a second of said networks successively in circuit with said first network being tuned to a high frequency portion of said band, and means providing a resistive element effectively in series with the inductive element of said second network.

3. A stagger tuned wide band amplifier system as defined in claim 2 wherein each of said amplifier stages provides for triode grounded grid operation of the electronic tube amplifiers therein.

4. A stagger-tuned wide-band amplifier as defined in claim 2 wherein the tunable inductive element of said first interstage coupling network comprises an auto transformer having a low impedance output tap, and the tunable inductive element of said second interstage coupling network comprises a coupling transformer including an output connection for a succeeding amplifier stage.

5. In a wide band stagger tuned signal amplifier of the electronic tube type, an anode circuit, a tuning inductance and coupling impedance connected serially in said circuit, a cathode circuit for a succeeding amplifier stage, means providing capacity coupling between the junction of said tuning inductance and impedance and the cathode circuit, an anode circuit for said succeeding amplifier stage, an auto transformer means having a winding serially connected in said circuit, a third amplifier stage having a cathode circuit and means providing a signal conveying connection between said last named cathode circuit and a tap on said auto transformer winding, and means including the interelectrodal capacities of the tuned elements of said amplifier for tuning said auto transformer to a glow frequency portion of a wide frequency band and for tuning said tuning inductance in the first plate circuit to a high frequency portion of a wide frequency band thereby to enhance the bandwidth response of said amplifier.

6. In a stagger tuned frequency band pass amplifier the combination comprising a source of signal voltage composed of a band of frequencies, a first stage tuned to a high frequency portion within said frequency band pass, said first stage comprising an electronic signal amplifying tube having cathode, anode, control grid elements, and capacitance between said elements, means for applying said signal voltage between said cathode and grid, a second stage tuned to a low frequency portion within said band pass, said second stage comprising an electronic signal amplifying tube having cathode, anode, control grid elements, and capacitance between said elements, a first inductance comprising at least one coil connected from said anode of the first stage to the cathode of the second said stage, said inductance forming a resonant circuit with the capacitance between the elements of the first signal amplifying tube, a second inductance comprising a second coil connected across the plate-grid circuit of said second tube, said second coil forming a resonant circuit with the capacitance of said second tube, a tap connected intermediate the ends of said second coil, an output circuit for the second tube, a pair of output terminals connected across a substantially resistive network, means connecting said tap of second coil to one of said output terminals, means connecting other output terminal to the grid of second tube, the outputs of said first and second stages overlapping to provide amplification of the signal over a substantial portion of the frequency band.

7. The combination as set forth in claim 5 wherein the tuning inductance comprises a transformer having a primary and secondary winding.

8. In a stagger tuned amplifying system, designed to amplify a band of frequencies, the combination comprising a first stage for amplifying signals composed of the lower frequencies within the band, a second stage for amplifying signals composed of the higher frequencies within the band, with the output from both stages overlapping to produce a signal output composed of an amplified band of frequencies, said first stage comprising a first amplifying electronic device having elements including a cathode, an anode and a control grid, with a capacitance between said elements, two input terminals, means connecting one of said terminals to a point of reference potential, means connecting the other terminal to the said cathode of the first amplifying electronic device, said grid of said first amplifying electronic device being directly connected to said point of reference potential, an input circuit to the second stage, said input being substantially resistive, means connecting the output of the first stage to the input circuit of the second stage, said second stage comprising a second amplifying electronic device having elements including a cathode, an anode and a control grid, with a capacitance between said elements, said grid being directly connected to said point of reference potential, a first inductance comprising an auto-transformer having a tap and being connected across the anode and the grid of said first amplifying device, said first inductance forming a resonant circuit with the capacitance of said first amplifying device, whereby amplification of the signal potential of the lower frequencies is attained, means connecting the tap of said auto-transformer to the cathode of said second electronic amplifying device, two output terminals connected across a substantially resistive load, a second inductance comprising a second coil connected from the plate of said second amplifying device to one of said terminals, the other of said terminals being returned to a point of reference potential and said second inductance forming a resonant circuit with said capacitance of said second amplifying device.

References Cited in the file of this patent

UNITED STATES PATENTS

| | | |
|---|---|---|
| 2,278,801 | Rust | Apr. 7, 1942 |
| 2,463,229 | Wheeler | Mar. 1, 1949 |
| 2,480,205 | Wallman | Aug. 30, 1949 |
| 2,524,821 | Montgomery | Oct. 10, 1950 |
| 2,571,045 | Macnee | Oct. 9, 1951 |
| 2,644,860 | Gadsden | July 7, 1953 |
| 2,680,788 | Hoxie | June 8, 1954 |
| 2,710,314 | Tongue | June 7, 1955 |
| 2,710,315 | Tongue | June 7, 1955 |

OTHER REFERENCES

Terman text, "Radio Engineering," 3rd ed., pages 345, 356, 359, 360. Pub. 1947 by McGraw-Hill Book Co., N. Y. C.